United States Patent [19]
Seliskar

[11] Patent Number: 5,985,705
[45] Date of Patent: Nov. 16, 1999

[54] LOW THRESHOLD VOLTAGE MOS TRANSISTOR AND METHOD OF MANUFACTURE

[75] Inventor: John J. Seliskar, Fort Collins, Colo.

[73] Assignee: LSI Logic Corporation, Milpitas, Calif.

[21] Appl. No.: 09/107,767

[22] Filed: Jun. 30, 1998

[51] Int. Cl.⁶ .................................................. H01L 21/336
[52] U.S. Cl. .......................... 438/197; 438/194; 438/282; 438/289; 257/336; 257/344; 257/345; 257/404; 257/408
[58] Field of Search ..................................... 438/194, 197, 438/282, 289, 290, 291, FOR 205, FOR 160, FOR 161, FOR 163, FOR 164; 257/336, 344, 345, 404, 408

[56] References Cited

U.S. PATENT DOCUMENTS

| | | | |
|---|---|---|---|
| 5,021,853 | 6/1991 | Mistry ................................... | 357/23.13 |
| 5,060,037 | 10/1991 | Rountree .............................. | 357/23.13 |
| 5,262,344 | 11/1993 | Mistry ................................... | 437/57 |
| 5,272,371 | 12/1993 | Bishop et al. ........................ | 257/362 |
| 5,493,251 | 2/1996 | Khambaty et al. ................... | 327/564 |
| 5,521,415 | 5/1996 | Kondo .................................. | 257/357 |
| 5,529,940 | 6/1996 | Yamamoto et al. .................. | 437/40 |
| 5,589,701 | 12/1996 | Baldi .................................... | 257/369 |
| 5,593,911 | 1/1997 | Lee et al. ............................. | 437/51 |
| 5,616,943 | 4/1997 | Nguyen et al. ...................... | 257/355 |
| 5,622,880 | 4/1997 | Burr et al. ............................ | 438/194 |
| 5,623,156 | 4/1997 | Watt ..................................... | 257/355 |
| 5,629,544 | 5/1997 | Voldman et al. ..................... | 257/355 |
| 5,650,340 | 7/1997 | Burr et al. . | |
| 5,661,045 | 8/1997 | Manning et al. ..................... | 438/286 |
| 5,719,422 | 2/1998 | Burr et al. ............................ | 257/336 |
| 5,719,733 | 2/1998 | Wei ...................................... | 361/56 |
| 5,744,839 | 4/1998 | Ma et al. .............................. | 257/356 |
| 5,751,042 | 5/1998 | Yu ........................................ | 257/360 |

*Primary Examiner*—Wael M. Fahmy
*Assistant Examiner*—Long Pham

[57] ABSTRACT

A low threshold voltage MOS device on a semiconductor substrate is disclosed. The substrate has an upper surface, and a first well region is disposed in said semiconductor substrate extending downwardly from the semiconductor substrate upper surface. The first well region includes a dopant of a first conductivity type having a first average dopant concentration. Source and drain regions of a second conductivity type are laterally spaced from each other and are disposed in the first well region, the source and drain regions extending downwardly from the semiconductor substrate upper surface a predetermined distance. A channel region comprising the first well region of the first conductivity type is disposed between the source and drain regions. The channel region also extends at least the predetermined distance below the semiconductor substrate upper surface. A second well region is disposed in the semiconductor substrate below the channel region, the second well region being of the first conductivity type having a second average dopant concentration. A buried electrode region is disposed below the source and drain regions between the second well region and the channel region. The buried electrode region has a dopant of the first conductivity type at a concentration which is greater than both the first and second dopant concentrations of the channel region and the second well region, respectively. Finally, a gate is disposed over the channel region with the buried electrode creating a low gate threshold voltage with significantly reduced likelihood of punch through.

20 Claims, 5 Drawing Sheets

LOW THRESHOLD NMOS DEVICE

5,985,705

LOW THRESHOLD VOLTAGE MOS TRANSISTOR AND METHOD OF MANUFACTURE

BACKGROUND OF THE INVENTION

1. Field of the Invention

This invention relates generally to high performance transistor devices and, more particularly, to low threshold voltage transistors. Specifically, the present invention relates to low Vt semiconductor devices having improved implanted well structure which permits short channel design while substantially reducing punch through characteristics, reduced threshold variation and high mobility.

2. Discussion of the Related Art

As the semiconductor industry has advanced, the sizes of active semiconductor transistor devices have shrunk to submicron dimensions. This has required the formation of devices that push the limits of known manufacturing techniques and processes. Semiconductor devices formed with a short channel length are particularly affected by manufacturing process variations. For example, short channel MOS (Metal Oxide Semiconductor) transistor devices can be difficult to manufacture with acceptable threshold voltage (Vt) control.

In a MOS transistor, the threshold voltage is the voltage or potential that must be applied to the gate region of the transistor before a current will flow in the channel below the gate region between the source and drain. In general, higher threshold voltages are undesirable because higher power supplies are required for operating the semiconductor devices. In addition, with higher threshold voltages, the semiconductor devices are slower. As power supply voltage decreases, analog circuitry can be adversely affected as the devices are stacked between Vdd and Vss. Moreover, this loss of "headroom" reduces the available voltage swing. Moreover, if the threshold voltage of an access device for a memory cell is too high, then it is more difficult to write data into the cell.

As MOS technology has evolved, the supply voltage (Vdd) has also scaled with the size of the devices. For example, as channel lengths have decreased, the supply voltages have correspondingly decreased. In many applications, it is desirable to provide lower supply voltages for given device sizes. This is because devices requiring lower supply voltages generally conserve power, a feature which is particularly desirable in systems which dissipate large amounts of energy or rely on limited power sources such as batteries. However, there has been some concern about the effects of low supply voltage on device performance.

In circuits made up of conventional MOS devices, the relationship of maximum frequency, or the performance of the circuit, to supply voltage and threshold voltage is governed by the long and short channel effects of the component MOS devices. It has been found that the performance of a circuit made up of truly long channel devices is dependent on the absolute value of the supply voltage. Consequently, if the supply voltage to the devices in such circuits is lowered, then performance is also lowered. However, in circuits made up of truly short channel devices, performance is governed by the ratio of threshold voltage to supply voltage. This means that in such circuits, the supply voltage can be lowered with no loss in performance so long as the threshold voltage is also lowered to maintain a constant Vt/Vdd ratio.

Thus, while low threshold voltage MOS devices appear to be desirable, there have been certain problems associated with such devices in the past. First, as the threshold voltage is lowered, the drain-to-source leakage current of the transistor increases. Leakage current is that current which flows across the channel region when the transistor is turned off. In applications where the device must frequently switch, such as in microprocessors, this does not cause a problem. However, in other applications where the device is normally inoperative or inactive, such as in memory devices, this is a significant problem. Moreover, in short channel devices having a low threshold voltage, the distance between the drain and source regions is very small, and if this distance becomes too small, the depletion regions of the source and drain in the channel region can overlap to cause punch through. When this occurs, current flows through the path between the source and drain created by the depletion regions overlapping even when the transistor is turned off. In such instances, the gate control of the channel is lost.

There have been numerous attempts to develop transistor devices which overcome the aforementioned problems. Some examples of these efforts are illustrated in U.S. Pat. No. 5,493,251, U.S. Pat. No. 5,529,940, U.S. Pat. No. 5,589,701, U.S. Pat. No. 5,661,045, U.S. Pat. No. 5,622,880 and U.S. Pat. No. 5,719,422. It is known that the threshold voltage of a short channel MOS device is very sensitive to the dopant concentration of the substrate of the device. As a result, many approaches used to form low threshold devices rely on counterdoping the "standard" threshold devices, resulting in significant mobility degradation. Conversely, approaches that rely on "natural" or very low doping levels suffer from short channel Vt rolloff or punch through. It is also known that the variation of the threshold voltage is affected by the number of implant steps required to set the Vt. Hence, counter-doped devices have higher variability. Moreover, in both high and low threshold voltage devices, it is known that a buried electrode region of relatively high dopant concentration will help to suppress growth of depletion regions and thereby reduce punch through. However, there is still a need for an improved high performance, short channel transistor device having a low threshold voltage which experiences little if any punch through characteristics while maintaining high mobility and low threshold variation.

SUMMARY OF THE INVENTION

Accordingly, it is one object of the present invention to provide an improved semiconductor device.

It is another object of the present invention to provide a low threshold voltage semiconductor device which exhibits reduced punch through.

Yet another object of the present invention is to provide a low threshold voltage semiconductor device having a buried electrode region below the source and drain regions of the device which permits short channel design with reduced punch through characteristics, reduced threshold variation and high mobility.

Still another object of the present invention is to provide a method of manufacturing such a semiconductor device.

To achieve the foregoing and other objects and in accordance with the purpose of the present invention, as embodied and broadly described herein, a low threshold voltage MOS device on a semiconductor substrate is disclosed along with its method of manufacture. The substrate has an upper surface, and a first well region is disposed in the semiconductor substrate extending downwardly from the semiconductor substrate upper surface. The first well region includes a dopant of a first conductivity type having a first average dopant concentration. Source and drain regions of a second conductivity type are laterally spaced from each other and are disposed in the first well region, the source and drain regions extending downwardly from the semiconductor substrate upper surface a predetermined distance.

A channel region made up of the first well region of the first conductivity type is disposed between the source and drain regions. The channel region also extends at least the predetermined distance below the semiconductor substrate upper surface. A second well region is disposed in the semiconductor substrate below the channel region, the second well region being of the first conductivity type having a second average dopant concentration. A buried electrode region is disposed below the source and drain regions between the second well region and the channel region. The buried electrode region has a dopant of the first conductivity type at a relatively low concentration which is nonetheless greater than both the first and second dopant concentrations of the channel region and the second well region, respectively. Finally, a gate is disposed over the channel region with the buried electrode creating a low gate threshold voltage with significantly reduced likelihood of punch through.

BRIEF DESCRIPTION OF THE DRAWINGS

The accompanying drawings which are incorporated in and form a part of the specification illustrate preferred embodiments of the present invention and, together with a description, serve to explain the principles of the invention. In the drawings.

DETAILED DESCRIPTION OF THE PREFERRED EMBODIMENTS

Low threshold devices are important particularly for analog circuits designed in the 0.35 µm 3.3 v technology and below because the low Vt device has improved gain/capacitance ratio. It has been discovered that the subthreshold characteristics of a low threshold voltage MOS transistor can be significantly improved by a moderate dose blanket boron implant positioned below the drain and source regions.

Knowledge of the general construction and operation of MOS transistors is well known as outlined by the above-identified U.S. Patents, the contents of which are specifically incorporated herein by reference, and will not be repeated herein unless necessary for the particular understanding of the present invention. Moreover, it should be understood that while most of the discussion herein is directed to an NMOS device, the present invention is applicable to PMOS devices as well.

MOS transistor threshold voltage is generally set by the thickness of the gate oxide, the doping level in the MOS transistor channel, the surface potential under the gate and the flatband voltage on the gate. The present invention lowers the threshold voltage of the low Vt NMOS device by lowering the dopant concentration of the NMOS substrate as described in detail below.

Figure 1:
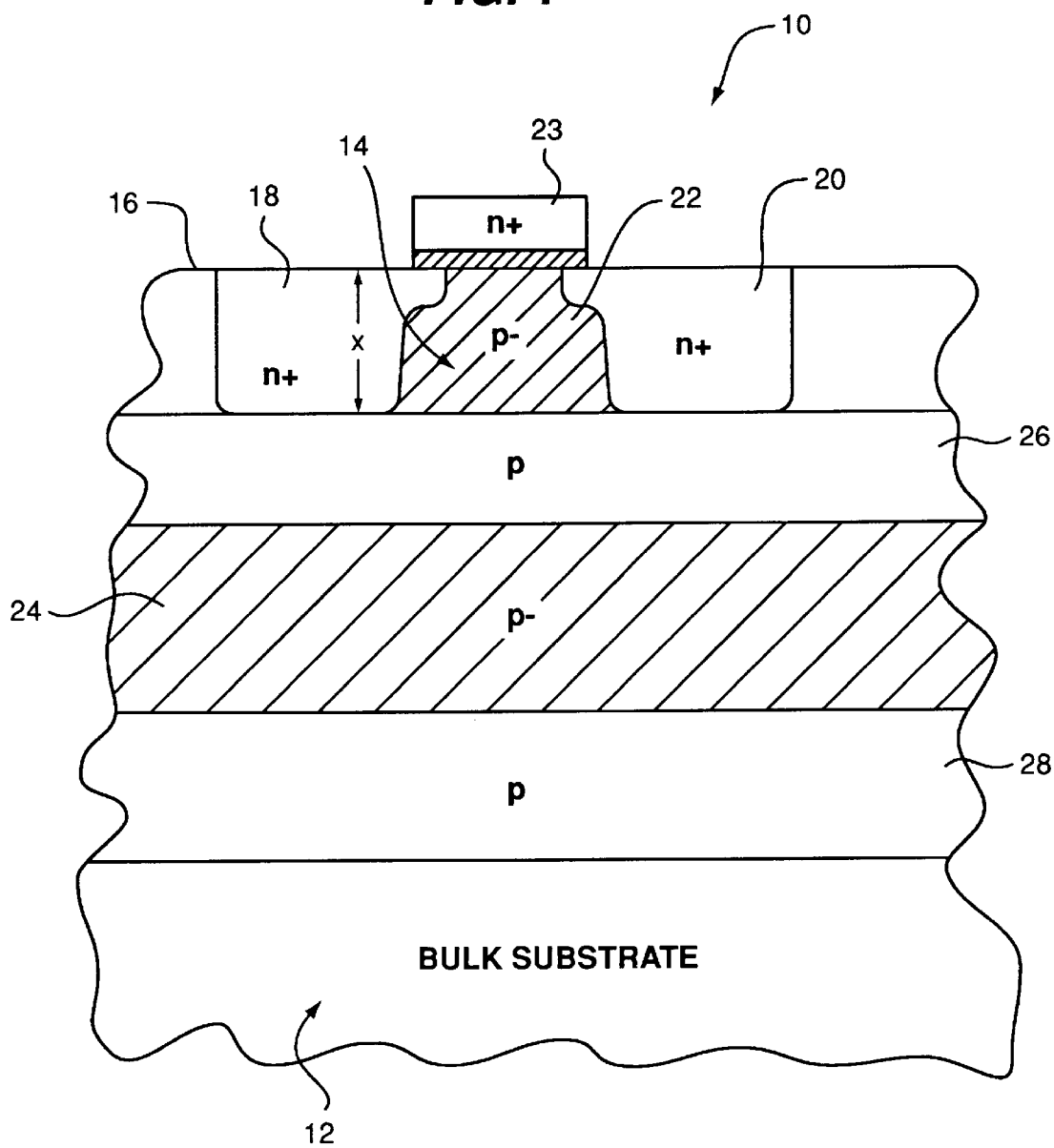
FIG. 1 is a partial side sectional view of a transistor having a buried electrode region and a low threshold voltage constructed in accordance with the present invention.
Figure 2:
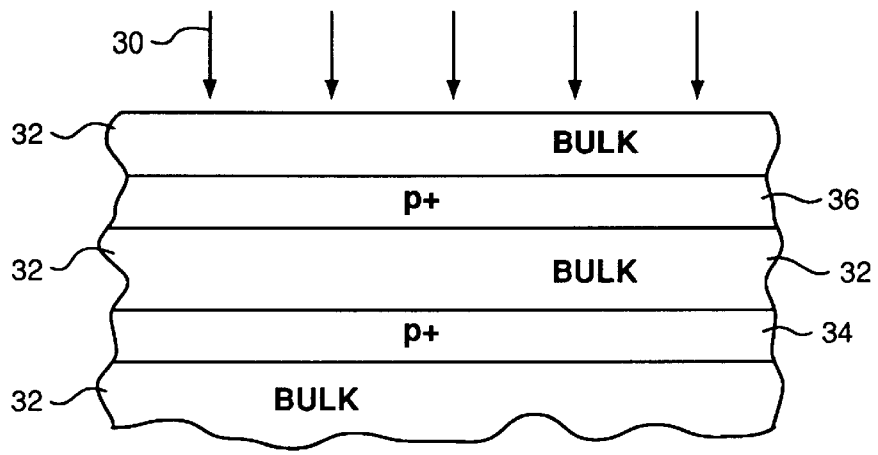
FIG. 2 is a partial side sectional view of a partially completed transistor constructed in accordance with the present invention and illustrating an initial phase of construction.
Figure 3:
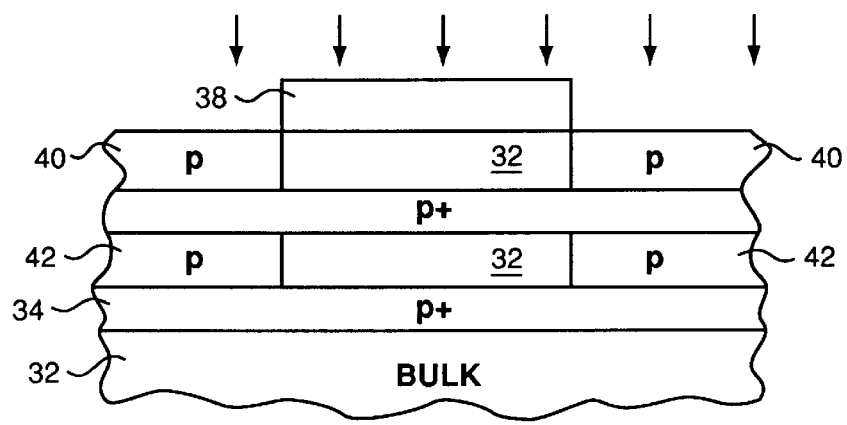
FIG. 3 is a partial side sectional view of a partially completed transistor constructed in accordance with the present invention similar to that of FIG. 2 but at a further advanced phase of construction.

Referring now to FIG. 1, a low Vt MOS device 10 constructed in accordance with the present invention is illustrated. The device 10 includes a bulk semiconductor substrate 12 preferably made from silicon or any other semiconductor material well known in the art. A first lightly doped well region 14 is disposed in the semiconductor substrate material 12 extending downwardly from the upper surface 16 thereof. This first well region 14 is of a first conductivity and preferably has a p-type dopant, preferably boron. A source region 18 and a drain region 20 are created at the surface of the first well region 14 and preferably extend a predetermined distance X down into the first well region 14 from the surface 16. In this illustrated embodiment, the source and drain regions 18, 20 are disposed at the lateral sides of the well 14. The source and drain regions 18, 20 are of a second conductivity type, which in the preferred embodiment is an n-type dopant. The source and drain regions 18, 20 are preferably constructed in accordance with standard techniques known to the art.

The source and drain regions 18, 20 are laterally separated from each other by a channel region 22 which effectively resides within the first well region 14. The channel region 22 is preferably lightly doped and in preferred form comprises the remaining portion of the first well region 14. Therefore, in the preferred embodiment the channel 22 has a light p-type dopant corresponding to the first well region 14. In preferred form, the channel region 22 extends the entire distance both laterally between the source and drain regions 18, 20 as well as vertically within the first well region 14 the predetermined distance X. A gate region 23 of standard and well known design is mounted to the source and drain regions 18, 20 above the channel 22.

In preferred form, the device 10 includes a second well region 24 which is spaced below the channel region 22 and the source and drain regions 18, 20. In the preferred embodiment, the second well region 24 is of the same first conductivity as the first well region 14 and the channel region 22. In the illustrated embodiment, the second well region 24 is lightly doped with a p-type dopant. The concentration of the first conductivity dopant in the first and second well regions 14, 24 may be approximately the same, or the dopant concentration of the implanted second well region 24 may be greater than the dopant concentration of the first well region 14 and channel region 22. In fact, the dopant concentration of the second well region 24 may be 10 to 100 times the dopant concentration of the first well region 14, although dopant concentrations of substantially the same are preferred.

As previously mentioned, buried electrode regions are known to assist in reducing punch through in MOS devices. However, these buried regions tend to have very high dopant concentrations and are positioned shallow in the substrate well above the bottom levels of the source and drain regions immediately adjacent the channel region. In the present invention, however, a buried electrode region 26 is provided below or under the source and drain regions 18, 20 and the predetermined distance X. In preferred form, the buried electrode region 26 separates the channel region 22 from the second well region 24 and is of the same conductivity type as the channel and second well regions 22 and 24. In the preferred embodiment, the buried electrode region 26 includes a p-type dopant that is of a higher concentration than the dopant concentrations of the channel and second well regions 22, 24. However, the dopant concentration of the buried electrode region 26 may be up to 10 to 100 times the dopant concentration of the channel region 22 and/or the second well region 24.

While the buried electrode region 26 may abut the bottom of the source and drain regions 18, 20, it is never positioned in the area directly between the source and drain regions 18, 20. In one embodiment of the invention described below, the buried electrode region 26 is in fact spaced below the bottom portions of the source and drain regions 18, 20 and is positioned deeper than the predetermined distance X from the substrate upper surface 16. This arrangement of the present invention provides a threshold voltage range of approximately −0.05 V to +0.4 V. The buried electrode region 26 aids in terminating the electric field from the drain region 20. Since the electric fields are terminated on a high conductivity electrode, the arrangement of the invention suppresses punch through regardless of the fact that the device 10 has a very short channel length.

In a still further embodiment of the present invention, the device 10 includes buried blanket region 28 disposed between the buried well 24 and the substrate base 12. This blanket region 28 is also of the first conductivity type and is generally of the same dopant type and concentration as the buried electrode region 26.

Referring to FIGS. 2–5, a preferred method of producing the present invention includes creating a high energy buried layer blanket implant 34 and a low energy buried layer blanket implant 36 in the silicon or other semiconductor substrate base 32. A preferred bulk material for the substrate is 1e14 ions/cm$^2$ p-type substrate. The preferred species of the implant is boron, and the blanket low Vt implant energy for layer 36 is critical. If the energy is too low, the implanted dopant ends up toward the surface of the device thereby reducing mobility and increasing Vt without improving the short channel characteristics of the device. The preferred energy of the low implant is approximately 90 to 120 keV while the dose of this implant is between 5e11 and 2e12 ions/cm$^2$. The most preferred implant is 1e12 ions/cm$^2$ Boron @ 100 keV. The low Vt adjusting implant step can be performed without any masking thereby potentially saving process cost and complexity.

Prior to forming the above blanket implant layers 34 and 36, field oxidation or shallow trans-isolation of the substrate in accordance with well known techniques of the art is performed for isolation. After the field oxidation step, the high-energy buried blanket implant layer 34 is created preferably using 3e13 to 5e13 ions/cm$^2$, and preferably 3e13, Boron @ about 2MeV. This high-energy blanket implant isolates or suppresses latch up. Then, the low Vt blanket layer 36 is formed as discussed above and N-well formation (not illustrated) typical of the art is then performed.

Figure 4:
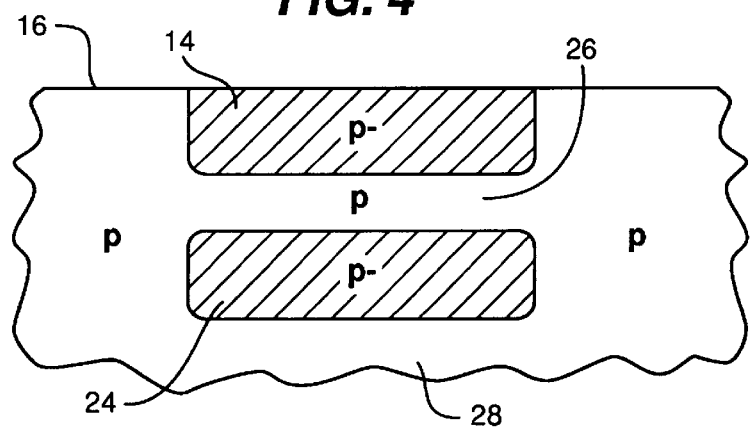
FIG. 4 is a partial side sectional view of a partially completed transistor constructed in accordance with the present invention similar to that of FIG. 3 but at a still further advanced phase of construction.

P-well formation then takes place. A mask 38 of standard design and composition is placed over the center portion of the substrate 32 masking or blocking the N-well portion and the low Vt device. P-well formation creates implants 40 and 42 and is preferably created by first performing a retrograde ion implant using 2e13 ions/cm$^2$ boron @ 700 keV. A second p-well ion implant is then performed using 1.2e13 ions/cm$^2$ boron @ 100 keV which is then followed by an N-channel Vt shallow implant using 2.5e12 ions/cm$^2$ BF$_2$@ 80 keV. The mask 38 is then removed and the structure annealed in accordance with known techniques and as illustrated in FIG. 4. When this occurs, the dopant migrates to form the first or upper P-well 14 and the buried second P-well 24 as described in FIG. 1. The buried electrode region 26 is also created between the first well region 14 and the second or buried well region 24. A gate region 23 is then positioned over the center portion of the first p-well 14 using known oxidation and poly etch techniques, and the source and drain regions 18 and 20 are then created, all as illustrated in FIG. 5 and in accordance with known techniques and principles.

Figure 5:
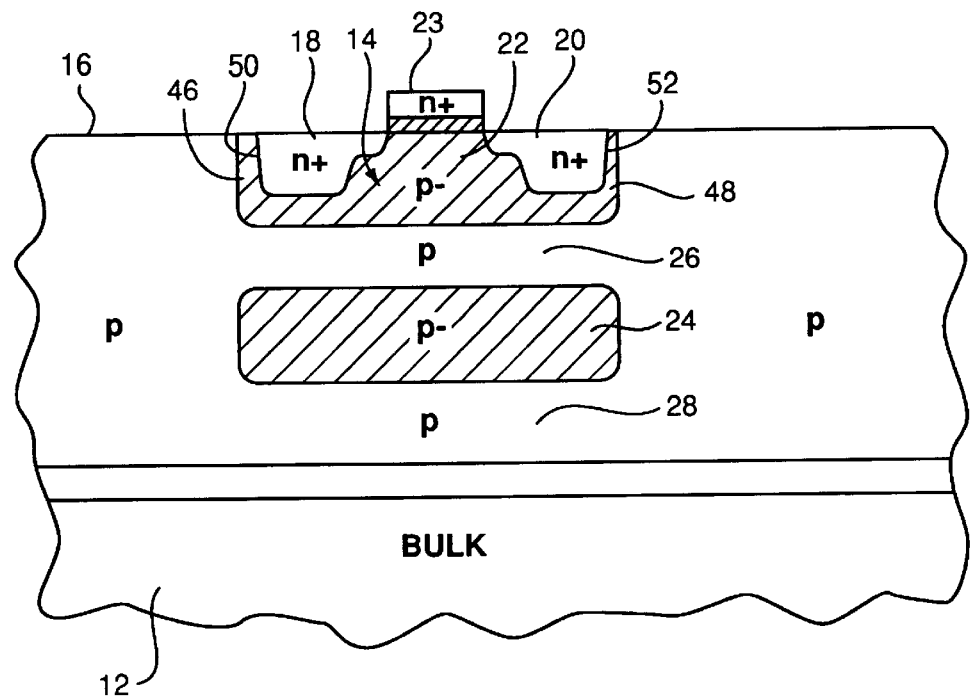
FIG. 5 is a partial side sectional view of a fully completed transistor having a buried electrode region and a low threshold voltage constructed in accordance with the present invention.

One difference in the construction of the Vt device of FIG. 5 illustrates an alternative embodiment of the present invention. As discussed with the embodiment of FIG. 1, the source and drain regions 18, 20 are positioned in the first or upper well region 14 at opposite lateral ends thereof. However, in this embodiment, the first well 12 has side boundaries 46 and 48 which surround and abut the facing edges 50, 52, respectively, of the source and drain regions 18, 20 while extending to the surface 16 of the substrate 12 in the device 10. Moreover, the well region 14 in the form of the channel region 22 may extend below the bottom of the source and drain regions 18, 20 a slight distance greater than the predetermined distance X.

Figure 6:
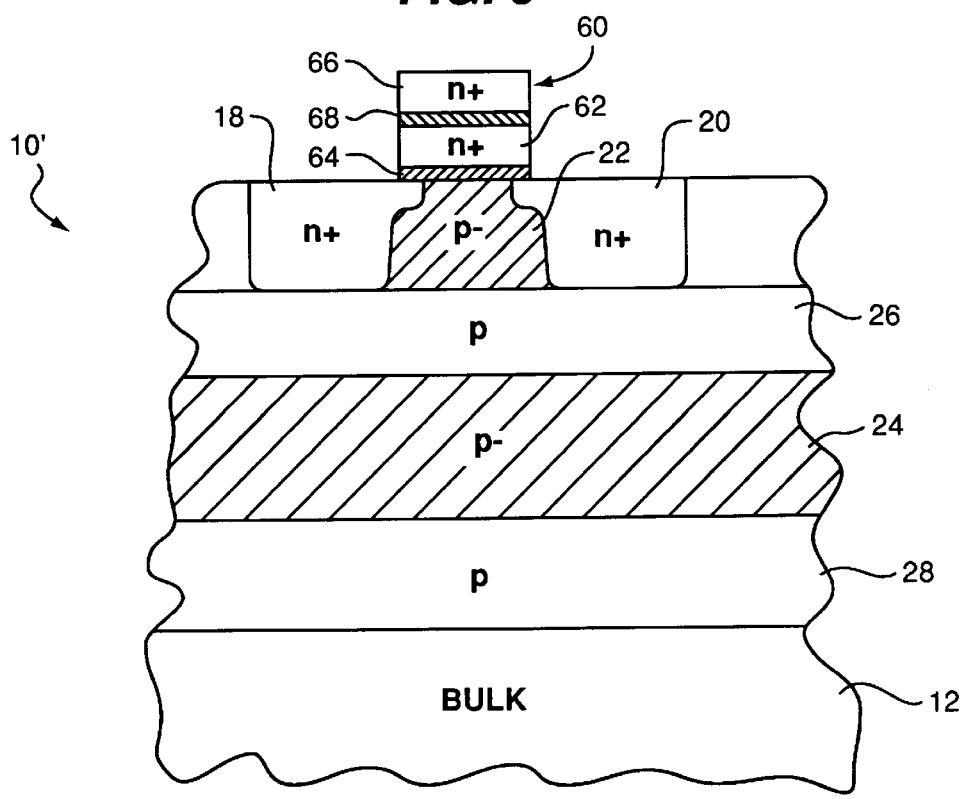
FIG. 6 is a partial side sectional view of a transistor having a buried electrode region with a floating gate structure and constructed in accordance with the present invention.
Figure 7A:
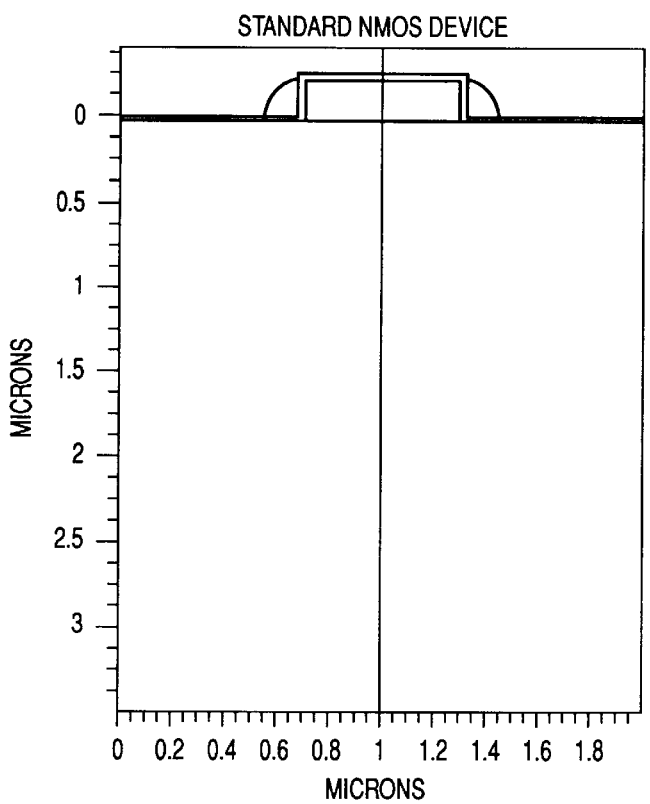
FIG. 7 is a series of graphs illustrating buried region dopant concentrations (FIG. 7D) in a device constructed in accordance with the present invention (FIG. 7C) as compared to buried region dopant concentrations (FIG. 7B) of a standard threshold device known in the art (FIG. 7A).
Figure 7B:
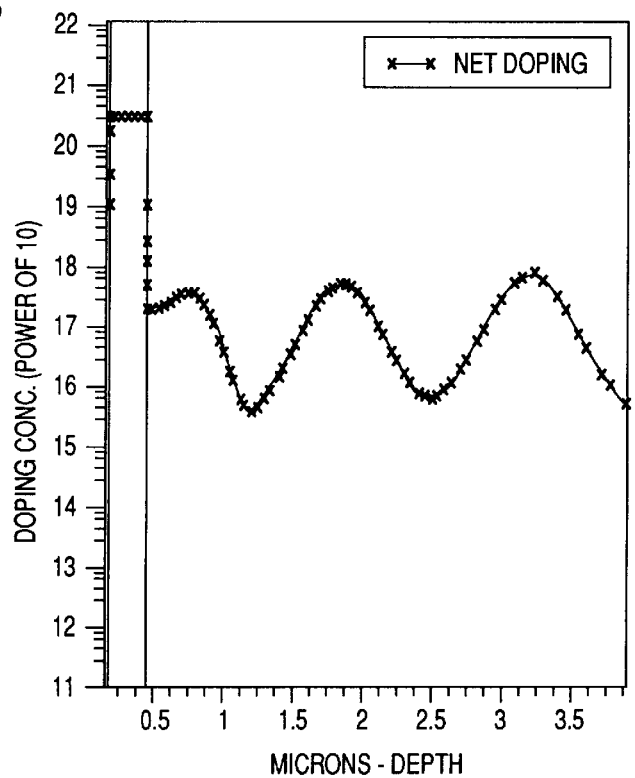
Figure 7C:
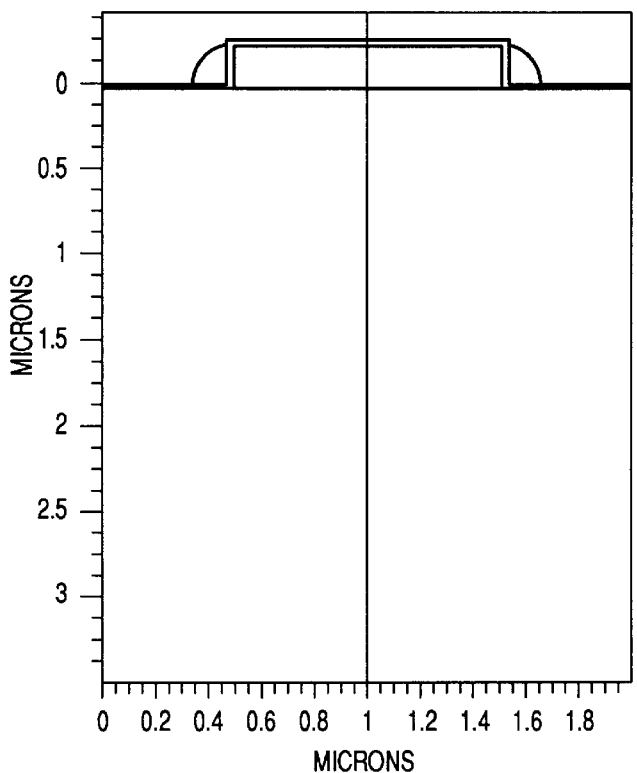
Figure 7D:
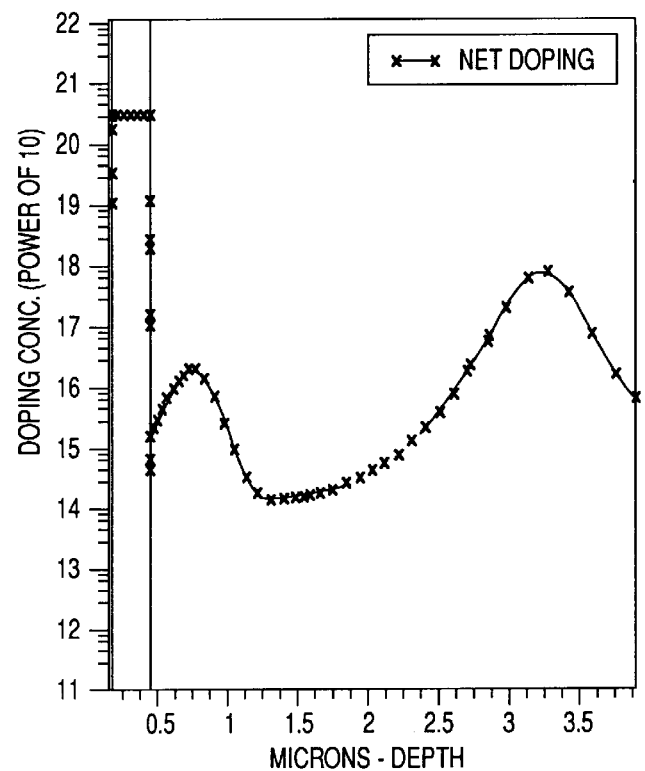

FIG. 6 illustrates an embodiment of the invention having a low threshold voltage that is tunable by a floating gate 60. The construction of the main structure of the device 10' is essentially the same as that of the device 10 previously described. However, this device 10' includes two gate layers in a floating gate structure 60. The first gate layer 62 is deposited on an oxide layer 64 while the second gate layer 66 is deposited on an insulating layer 68. As is known in the art, a fixed voltage and associated charge may be applied to the first gate 62 to control the threshold voltage of the gate 60.

Referring now to FIG. 7, a comparison of the dopant concentrations of the present invention with a standard NMOS device is shown. The standard device illustrated in FIG. 7A produces the several dopant concentrations illustrated in FIG. 7B. However, a device constructed in accordance with the present invention is shown in FIG. 7C with a deep dopant concentration of over $10^{18}$ atoms/cm$^3$ at about 3 microns deep. This produces a Vt MOS device having a low threshold voltage of approximately −0.05 V to +0.4 V without any significant punch through. This takes place with a short channel length of 1.5 $\mu$m down to 0.6 $\mu$m.

As can be seen from the above, the present invention provides a transistor device which operates with a very low threshold voltage in a short channel length arrangement. This enables short channel lengths and higher bandwidths. This arrangement also provides a MOS device wherein the electric fields are terminated onto a high conductivity electrode while suppressing punch through. The advantage of suppressing punch through coupled with short channel lengths eliminates leakage current while maintaining the gate voltage below the threshold voltage.

The foregoing description and the illustrative embodiments of the present invention have been described in detail in varying modifications and alternate embodiments. It should be understood, however, that the foregoing description of the present invention is exemplary only, and that the scope of the present invention is to be limited to the claims as interpreted in view of the prior art. Moreover, the invention illustratively disclosed herein suitably may be practiced in the absence of any element which is not specifically disclosed herein.

What is claimed is:

1. A method of fabricating a MOS transistor comprising the steps of:

forming a bulk region having a first conductivity type dopant in a semiconductor substrate material and including an upper well region of said first conductivity type having a first dopant concentration and a buried well region of said first conductivity type having a second dopant concentration, said upper and buried well regions being spaced by a buried electrode region of said first conductivity type with a dopant concentration greater than both said upper and buried well regions;

forming source and drain regions of a second conductivity type dopant in said upper well region laterally spaced so as to be separated by a channel region made up of said upper well region, said channel region extending at least as deep into said bulk region as said source and drain regions and being disposed above said buried electrode and said buried well region; and forming a gate over said channel region.

2. The method as claimed in claim 1, wherein the step of forming said bulk region includes a separate step of forming said buried electrode region, said buried electrode dopant concentration being an amount effective to create a gate threshold voltage of about −0.05 to 0.4 V to significantly reduce the likelihood of punch through.

3. The method as claimed in claim 1, wherein said step of forming said buried electrode region is a low energy boron implant of 5e11 to 2e12 ions/cm$^2$ Boron @ 90 to 120 keV.

4. The method as claimed in claim 1, wherein said buried electrode region is formed in contact with the bottom surfaces of said drain and source regions.

5. The method as claimed in claim 1, wherein said source and drain regions are formed so that said upper well region has side boundaries that surround and abut the facing edges of said source and drain regions while extending to said semiconductor substrate upper surface.

6. The method as claimed in claim 1, wherein said channel region extends below said source and drain regions to separate said source and drain regions from said buried electrode region.

7. The method as claimed in claim 1, wherein said first and said second dopant concentrations of said first conductivity type are substantially the same.

8. The method as claimed in claim 1, wherein the dopant concentration of said buried electrode region is greater than the dopant concentration of said buried well region.

9. The method as claimed in claim 1, wherein the dopant concentration of said channel region is approximately 10 to 100 times greater than the dopant concentration of said buried well region.

10. The method as claimed in claim 1, wherein the dopant concentration of said buried electrode region is approximately 10 to 100 times greater than the dopant concentration of said channel region.

11. The method as claimed in claim 1, wherein the dopant concentration of said buried electrode region is in an amount effective to create a gate threshold voltage in said device of approximately −0.05 to +0.4 V to significantly reduce the likelihood of punch through.

12. A method of fabricating a low threshold MOS device on a semiconductor substrate comprising the steps of:

performing a high energy buried layer blanket implant to form a high energy first conductivity type layer in the bulk semiconductor substrate;

performing a low energy buried layer blanket implant in the bulk semiconductor substrate to form a low energy first conductivity type layer therein spaced above said high energy implant layer;

creating an N-well in said bulk semiconductor substrate;

masking a portion of said substrate containing said N-well;

performing a series of ion implants to create a P-well of said first conductivity;

removing said mask and annealing said substrate to form an upper well region of said first conductivity type having a first dopant concentration and a buried well region of said first conductivity type having a second dopant concentration, said upper and buried well regions being spaced by a buried electrode region of said first conductivity type with a dopant concentration greater than both said upper and buried well regions;

forming a gate over the center portion of said upper well region; and forming two implants of a second conductivity type dopant in said upper well region laterally spaced so as to create source and drain regions separated by a channel region which is made up of said upper well region, said channel region extending at least as deep into said upper well region as said source and drain regions and being disposed above said buried electrode and said buried well region.

13. The method as claimed in claim 12, wherein said low energy buried layer blanket implants are formed utilizing between 5e11 and 2e12 ions/cm$^2$ Boron @ 90 to 120 keV.

14. The method as claimed in claim 12, wherein said high energy buried layer implant is formed using approximately 3e13 to 5e13 ions/cm$^2$ Boron at about 2 MeV.

15. The method as claimed in claim 12, wherein said buried electrode region is formed in contact with the bottom surfaces of said drain and source regions.

16. The method as claimed in claim 12, wherein said first and said second dopant concentrations of said first conductivity type are substantially the same.

17. The method as claimed in claim 12, wherein the dopant concentration of said channel region is greater than the dopant concentration of said buried well region.

18. The method as claimed in claim 12, wherein the dopant concentration of said buried electrode region is approximately 10 to 100 times greater than the dopant concentration of said buried well region.

19. The method as claimed in claim 12, wherein the dopant concentration of said buried electrode region is approximately 10 to 100 times greater than the dopant concentration of said channel region.

20. The method as claimed in claim 12, wherein the dopant concentration of said buried electrode region is in an amount effective to create a gate threshold voltage in said device of approximately −0.05 to +0.4 V to significantly reduce the likelihood of punch through.

* * * * *